United States Patent [19]

Drazin et al.

[11] Patent Number: 4,586,990
[45] Date of Patent: May 6, 1986

[54] CHELATING METALS

[75] Inventors: Shepard Drazin, Los Angeles; William P. Van Antwerp, Pacific Palisades, both of Calif.

[73] Assignee: GSP Metals & Chemicals Corporation, Los Angeles, Calif.

[21] Appl. No.: 579,481

[22] Filed: Feb. 13, 1984

Related U.S. Application Data

[63] Continuation-in-part of Ser. No. 357,907, Mar. 15, 1982, abandoned.

[51] Int. Cl.$^4$ .......................... C25D 3/56; C25D 3/60; C23C 30/00
[52] U.S. Cl. .................... 204/44.4; 204/53; 204/54 R; 106/1.22
[58] Field of Search ............... 204/44.4, 53 R, 54 R, 204/DIG. 2; 106/1; 428/620, 630

[56] References Cited

U.S. PATENT DOCUMENTS

| | | | |
|---|---|---|---|
| 2,751,341 | 6/1956 | Smart | 204/43 S |
| 3,120,550 | 2/1964 | Langer | 204/53 R |
| 3,152,155 | 10/1964 | Langer | 204/54 R |
| 3,249,408 | 5/1966 | Marafioti | 428/630 |
| 3,625,837 | 12/1971 | Nelson et al. | 204/15 |
| 3,875,029 | 4/1975 | Rosenberg et al. | 204/43 S |
| 3,956,123 | 5/1976 | Rosenberg et al. | 204/43 S |
| 4,135,991 | 1/1979 | Canaris et al. | 204/DIG. 2 |
| 4,139,425 | 2/1979 | Eckles et al. | 204/54 R |
| 4,263,106 | 4/1981 | Kohl | 204/54 R |

FOREIGN PATENT DOCUMENTS

| | | | |
|---|---|---|---|
| 0208509 | 4/1955 | Australia | 204/43 S |
| 49-93236 | 5/1974 | Japan | 204/43 S |
| 0103936 | 9/1978 | Japan | 204/44.4 |
| 0063689 | 4/1982 | Japan | 204/44.4 |

Primary Examiner—John F. Niebling
Assistant Examiner—Terryence Chapman
Attorney, Agent, or Firm—Lyon & Lyon

[57] ABSTRACT

A method for plating metallic leads or terminals of integrated circuits having a leaded glass component with a plating composition that avoids dentrite growth, can be soldered, and is corrosion resistant is disclosed. According to the method, the metallic element is electroplated with lead and tin simultaneously. An aqueous plating solution comprising water, sulphate ion, tin, and chelated lead, where the lead is chelated with either ethylene diamine or ethylene diamine gluconate, is formed. The metallic element with a leaded glass portion is placed in the solution and an electrical current is passed through this solution to deposit lead and tin on the metallic element to form a plating comprising at least about 90 percent by weight tin, and at least about 2 percent by weight lead. The plating solution and the plated substrate produced by the method of the present invention are also novel.

12 Claims, 1 Drawing Figure

DECOMPOSITION RATE OF LEAD COMPLEX

△ Pb (EDTA) (LEAD ETHYLENEDIAMINE TETRAACETIC ACID)
□ Pb (en)$_2$(glu)·Cl (LEAD BIS (ETHYLENEDIAMINE) GLUONATE)
○ Pb (en)$_3$Cl$_2$ (LEAD TRIS (ETHYLENEDIAMINE))

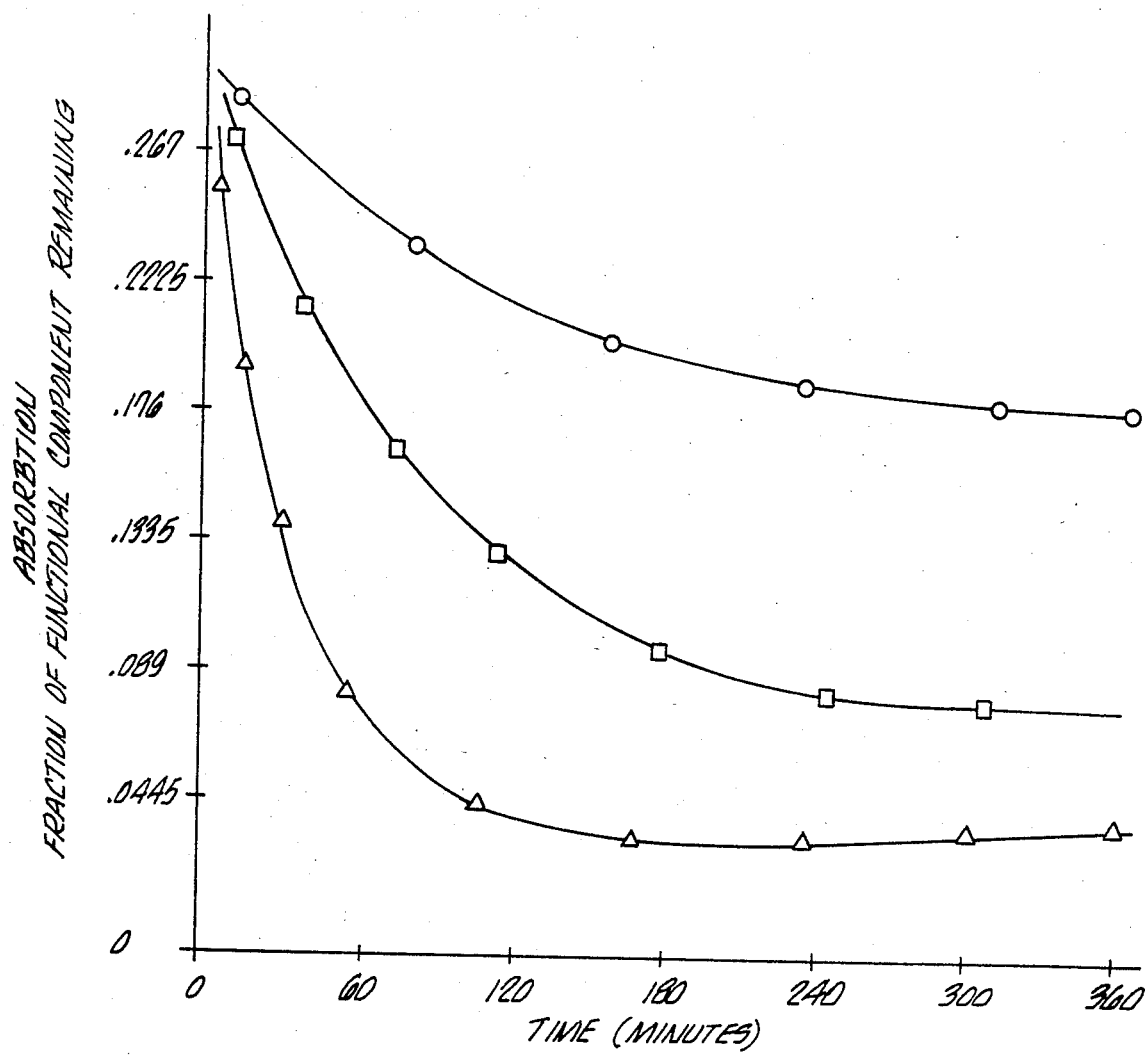

CHELATING METALS

This application is a continuation-in-part of Ser. No. 357,907, filed Mar. 15, 1982, entitled 'Chelating Metals' and now abandoned.

BACKGROUND

This invention relates to electroplating metal elements.

In microelectronic devices there are semi-conductor components with integrated circuits formed on a substrate, often of leaded glass. The circuits or chips, as they are often called, have metallic elements, terminals or leads, which leave the integrated circuit for connection to other circuitry. These terminals are conventionally formed as spaced parallel fingers and have in the past been plated with pure tin to a thickness of about 200 to 300 micro inches. The plating has included as a co-deposit a brightner such as Janus Green, or a product 6487-Igepal from Dow Chemicals, or Schlotter Tin, a product available through Learonal Corporation in the United States.

These organic brightners provide a uniform flowability to the tin and also provide a better brighter cosmetic finish. As such these terminals permit the soldering of very fine wires. Without such brightners the appearance of the terminals will be matt-like and the performance of the terminals in so far as the uniform flowability will be reduced.

In practice it has been found with such terminals that whiskers or dendrites gradually grow between the parallel terminals as a result of electrical current passing through these terminals. Over time the dendrites form a short circuit between these terminals with consequent serious results, especially where the microelectronic device is involved in high technology equipment such as spacecraft, computers, aircraft and the like.

As a result of the falure rate with these known components, the United States government has recently introduced higher specifications for the components to be applied in military applications. This requires that the plating no longer include the organic brightners of the kind mentioned. The specifications, however, do call for a product having sufficient metal flow of the terminals that solderability and corrosion resistance requirements are achieved. Preferably the product should also have the cosmetic brightness characteristics of known products having brighteners. Specifically, the specification calls for the tin plate to be between 200 to 800 micro inches (5.08 to 20.32 micro millimeters) thick. It should also be dense, homogenous, continuous and free of co-deposited organic material. Bright acid tin plate is prohibited.

One solution to obtain the improved reflow characteristics of such tin plating is to use organic and inorganic fluxes; however, this is generally undesirable since the fluxes normally contain chlorides which attack the leaded glass substrate.

Another prepared solution to the above difficulties is the addition of lead to the plating composition. This prevents the growth of whiskers and dendrites.

One method of applying a tin-lead composition to the terminals is to dip a tinned terminal after electroplating into a hot solder dip of tin and lead mixture so as to obtain an eutectic coating on the terminals. A disadvantage with this approach is that the hot dip tends to break the glass substrate as a result of the sudden temperature change.

A possible solution is the co-deposit of tin and lead during electroplating. Where tin-lead plating as a co-deposit is used as an alternative to tin plating the Government specificiations require that the lead proportion shall be 2% to 50% by weight and it should be homogeneously co-deposited.

However, electroplating with tin and lead in a chloride or borate solution is not feasible because chlorides and borates attack leaded glass. Further lead is not soluble in a sulfate plating solution.

Thus, there is a need for a method to plate a metallic lead or terminal of an integrated circuit having a leaded glass component with a plating composition that avoids dendrite growth, that can be soldered, and is corrosion resistant.

SUMMARY

The present invention is directed to a method that satisfies this need. According to this method, a metallic element is electroplated with lead and tin simultaneously by forming an aqueous plating solution that comprises water, sulfate ion, tin, and chelated lead. The tin is present in an amount effective for electroplating, and in an amount of at least 0.1 ounce as tin sulfate per gallon of water. The lead is present in an amount of at least about 2 parts by weight per 100 parts by weight tin. The element to be plated is placed in this plating solution, and an electrical current is passed through this solution to deposit lead and tin on the metallic element. By adjusting the amount of tin and lead present in the plating solution, a plating comprising at least 90% by weight tin and at least 2% by weight lead can be formed.

The lead is solublized in the sulfate solution by use of a chelating agent that is bifunctional and is capable of forming with lead a five or six member group that is both soluble and stable in a sulfate solution.

The plating solution and the plated substrate produced by the method of the present invention are also novel. The plated substrate can include a plating comprising co-deposited tin and lead, and preferably consists essentially of tin and lead, containing essentially no brighteners.

Thus, the present invention can result in an integrated circuit that has a leaded glass component, where the leads or terminals of the circuit are coated with a plating composition that avoids dendrite growth, that can be soldered, and is corrosion resistant.

BRIEF DESCRIPTION OF THE DRAWING

FIG. 1 is a graph that illustrates the decomposition rate of various lead complexes by plotting the fraction of the functional component remaining versus time.

DETAILED DESCRIPTION

A method is provided for the plating of a metallic element such as the parallel terminals from a microelectronic component which includes an integrated circuit with a leaded glass substrate. The terminals are metallic elements, typically made of Kovar (Alloy 42) which are to be plated such that there is plating comprising a co-deposit of tin and lead. The metallic element can be made of an electrically conductive metal or alloy. This co-deposit should be in the range of at least 50% tin and no more than about 50% lead, and preferably at least 95% tin and no more than 5% lead. In a preferred embodiment the plating has about 98% by weight tin and about 2% by weight lead. Preferably the coating consists essentially no brighteners.

As lead is normally insoluble in an aqueous sulfate solution which is constituted by a solution of sulfuric acid as the electrolyte in an electroplating system, the lead is chelated to ensure a sufficiently soluble solution whereby the lead can co-deposit on the metallic element to be plated.

In the electroplating system the anode would be constituted by an allotrop of tin which in solution becomes stannic tin and stannous tin, and the metallic element to be plated constitutes the cathode. During electroplating, the tin from the anode passes to deposit on the cathode element. By placing in the electolyte solution a lead-chelate composition, the lead itself can be retained sufficiently soluble in the solution so to effectively co-deposit on the cathode.

The chelated lead is preferably added to the sulfate solution as a liquid of desired concentration, or as a solid wherein complexing has been effected to a chelating agent which renders the lead complex both stable and soluble in the aqueous sulfate bath.

The plating solution contains water, sulfuric acid, a wetting agent, tin, and chelated lead. Typically the sulfuric acid is present in amount of 10% by volume based on the volume of the sulfuric acid and water.

The wetting agent is used to assure that an even deposit of plating occurs on the metallic element. A suitable wetting element is Triton X-100 available from Rphm & Haas in an amount of about 2 grams per gallon of water.

The tin can be provided as stannous sulfate in an amount of at least about 0.1 ounce (weight), and typically from about 2 to about 4 ounces (weight) per gallon of water.

The amount of chelated lead used depends upon the composition of the plating desired. For the plating to contain at least about 95% tin and from about 2 to about 5% lead, the plating solution contains chelated lead in an amount sufficient to yield at least 2 parts by weight, and preferably from about 5 to about 10 parts by weight per 100 parts by weight tin.

The chelated lead can be prepared according to conventional techniques. In one technique, the chelating agent is dissolved in water in an amount of 10% by weight chelating agent. Then lead nitrate is added to the water with a palladium or platinum charcoal catalyst, the mixture is heated to about 65° C., to yield the chelated lead plus excess chelating agent, which is present in more than stoichiometric quantity. The chelated lead is extracted from this mixture at about 40° C. with an ethanol/methanol mixture, about 95 pbw ethanol and about 5 pbw methanol. The solvent is evaporated to yield a solid lead chelate, which can be directly added to the plating solution, or first dissolved in water.

In an exemplary electroplating composition the proportions of the elements are as follows:

In an electrolyte being one U.S. gallon (4 liters), the sulfuric acid constitutes 10% by weight, and the water 90% by weight. To this in solution there are added about four ounces (120 grams) of tin sulfate. A lead chelated with ethylenediamine is added to the solution in an amount of half to one ounce (20 grams) so as to constitute abut 16% of the solution. In this lead complex about half is lead metal thereby constituting about 5% of the metal relative to the tin metal content.

By applying an electric potential between the cathode and anode with an electrolytic bath so composed, an effective co-deposit of 5% tin and 95% lead is achieved on the metallic element at the cathode. The current applied is in the order of from 1 to 10 amps per square foot of substrate being plated. For high speed plating, 500 amps or higher per square foot can be used. It takes about 10 to about 14 minutes to plate a substrate with a thickness of about 200 micro-inches.

The chelating agent is bifunctional, i.e., has at least two chelating groups, either two acid groups, an acid and a base group. Suitable chelating agents for the lead are bifunctional chelating agents capable of forming a five or six member ring with the lead and being capable of solublizing lead in a sulfate solution.

The chelating agent must also be capable of forming a lead-chelate composition which will remain stable in a sulfuric acid bath. For example, EDTA a commonly used chelating agent, was tested along with ethylenediamine and ethylenediamine gluconate for their ability to form lead-chelate compositions stable in a sulfuric acid bath.

Each agent to be tested was prepared in the manner of the invention. The agent was chelated with lead by dissolving 10% by weight chelating agent in water. Then the lead salt was added along with a catalyst and the mixture was heated to about 65° C. The resulting chelated lead was extracted with an ethanol methanol mixture and the solvent evaporated. The resulting lead-chelate solid was then dissolved in a 10% by weight sulfuric acid solution. The lead-chelate complex was then measured by absorption spectroscopy. The results are reported in Table I and illustrated in FIG. I.

As can be seen from FIG. I the lead-EDTA composition readily dissociates upon exposure to the sulfuric acid bath of the present invention. Ethylenediamine, however, forms a highly stable lead chelate composition in the sulfuric acid bath. Accordingly, for purposes of the present invention to be "stable" a chelating agent must be capable of forming a lead chelate composition which when added to a sulfuric acid solution will not disassociate to an amount below that which would permit effective electroplating of the lead.

The complex between lead ions and the chelating agent produces a composition that is sufficiently soluble in the sulfate solution and will not disassociate upon exposure to the sulfate bath so that effective electroplating of the lead on the substrate can be accomplished.

Chelating agents such as an organo-oxy-anions, acidic chelating agents, alkylacetones, neutral chelating agents, and organo-hetero-anionic chelating agents, which form lead-chelate compositions which are stable in sulfuric-acid are suitable.

Chelating agents that have been found successful are gluconic acid, diethyl glycine, triethylphosphine. Materials found to be unsuccessful are triethylamine triamine, and acetic acid. The acidic chelating agent ethylenediamine gluconate is preferred. Most preferred is the neutral chelating agent ethylenediamine. Combinations of more than one chelating agent can be used.

In tests with a metallic element so-plated, life cycling at a temperature of 200° F. for over 48 hours shows a highly utile product which has superior soldering capabilities and an acceptable appearance. Dendrite and whisker growth has not occured. The plated element satisfies MIL Spec 3.5.6.2.

Although the invention has been described with reference to terminals for microelectronic circuitry, the invention also has application to other products which require plating.

The relative amounts of metal being co-deposited can be changed. Thus, the amount of lead complex agent present can be adjusted between different percentages to provide co-deposits between 50% lead and 50% tin on the one hand and less than 1% lead and more than 99% tin on the other hand.

Many changes with widely differing embodiments can be provided for this invention without departing from the scope thereof. All matter contained in the above description shall be interpreted as illustrative and not limiting, the invention being interpreted solely by the scope of the appended claims.

TABLE I
LEAD COMPLEXES STABILITY DATA

| TIME (minutes) | ETHYLENEDIAMINE (fraction of functional component remaining) | ETHYLENEDIAMINE GLUCONATE (fraction of functional components remaining) | EDTA (ethylenediamine tetraacetic acid) (fraction of functional component remaining) |
|---|---|---|---|
| 0 | .289 | .296 | .286 |
| 1 | .289 | .295 | .28 |
| 2 | .289 | .292 | .272 |
| 3 | .289 | .29 | .265 |
| 4 | .289 | .29 | .25 |
| 5 | .289 | .289 | .244 |
| 10 | .288 | .285 | .22 |
| 15 | .288 | .268 | .202 |
| 20 | .288 | .257 | .19 |
| 25 | .285 | .24 | .189 |
| 30 | .28 | .225 | .18 |
| 35 | .275 | .2 | .15 |
| 40 | .273 | .19598 | .14 |
| 42 | .27 | .19 | .12 |
| 50 | .266 | .18 | .1 |
| 55 | .26 | .172 | .085 |
| 60 | .255 | .165 | .065 |
| 75 | .24 | .158 | .05 |
| 90 | .235 | .15 | .048 |
| 105 | .23 | .14 | .044 |
| 120 | .226 | .13 | .04 |
| 135 | .22 | .122 | .04 |
| 150 | .218 | .114 | .04 |
| 180 | .204 | .096 | .04 |
| 240 | .19 | .09 | .04 |
| 300 | .185 | .083 | .04 |
| 360 | .18 | .077 | .04 |

What is claimed is:

1. A method for electroplating a metallic element with lead and tin simultaneously, the plating comprising at least 2% by weight lead and at least 90% by weight tin, the metallic element being part of a component that includes a leaded glass portion, the method comprising the steps of:
   (a) forming an aqueous plating solution comprising water, sulfate ion, tin in an amount effective for electroplating, and chelated lead in an amount of at least about two parts by weight lead per 100 parts by weight tin, where the lead is chelated with a bifunctional chelating agent capable of forming with lead a five or six member group that is both stable and soluble in a sulfate solution, said chelating agent being selected from either ethylene diamine or ethylene diamine gluconate;
   (b) placing a component comprising a metallic element and a leaded glass portion in the plating solution; and
   (c) passing an electrical current through the solution to deposit lead and tin on the metallic element to form a plating comprising at least about 90% by weight tin and at least about 2% by weight lead.

2. A method for electroplating a metallic element with lead and tin simultaneously comprising the steps of:
   (a) forming an aqueous plating solution comprising water, sulfate ion, tin, and chelated lead in an amount effective for electroplating when the chelated lead is chelated with a chelating agent capable of forming a chelated lead which is both stable and soluble in sulfate solution, such chelating agent being selected from either ethylenediamine or ethylenediamine gluconate;
   (b) placing a metallic element in the aqueous plating solution; and
   (c) passing an electrical current through the solution to deposit lead on the metallic element.

3. The method of claim 1 or 2 in which the plating solution contains at least one ounce by weight of tin as $SnSO_4$ per gallon of water.

4. The method of claim 2 in which the plating solution comprises at least two parts by weight lead per 100 parts by weight tin.

5. A composition suitable for electroplating comprising:
   (a) water;
   (b) sulfate ion;
   (c) tin; and
   (d) chelated lead in an amount sufficient for electroplating a metallic element where the chelated lead is chelated with a chelating agent capable of forming a lead chelate which is both stable and soluble in a sulfate solution, such chelating agent being selected from either ethylenediamine or ethylenediamine gluconate.

6. The composition of claim 5 comprising at least 2 parts by weight lead per 100 parts by weight tin.

7. An electroplating solution comprising:
   (a) water;

(b) sulfuric acid in an amount of 10% by volume of the volume of water;
(c) a wetting agent;
(d) at least about 0.1 ounce of tin sulfate per gallon of water; and
(e) chelated lead in an amount of at least about 2 parts by weight lead per 100 parts by weight tin, the lead being chelated with a bifunctional chelating agent capable of forming with lead a five or six member group that is both stable and soluble in a sulfate solution.

8. The solution of claim 7 in which the chelating agent is ethylenediamine.

9. The solution of claim 7 in which the chelating agent is ethylenediamine gluconate.

10. The solution of claim 7 in which the chelating agent is an organo-oxy-anion.

11. The solution of claim 10 in which the chelating agent is gluconic acid.

12. The solution of claim 10 in which the chelating agent is diethylglycine.

* * * * *